United States Patent
Norton et al.

(10) Patent No.: US 10,349,560 B2
(45) Date of Patent: Jul. 9, 2019

(54) COOLING MODULE

(71) Applicant: HEWLETT PACKARD ENTERPRISE DEVELOPMENT LP, Houston, TX (US)

(72) Inventors: John Norton, Houston, TX (US); James Lee Armes, Fort Collins, CO (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 0 days.

(21) Appl. No.: 15/788,486

(22) Filed: Oct. 19, 2017

(65) Prior Publication Data
US 2019/0124797 A1 Apr. 25, 2019

(51) Int. Cl.
*H05K 7/20* (2006.01)

(52) U.S. Cl.
CPC ..... *H05K 7/20781* (2013.01); *H05K 7/20136* (2013.01); *H05K 7/20172* (2013.01); *H05K 7/20218* (2013.01); *H05K 7/20272* (2013.01); *H05K 7/20736* (2013.01)

(58) Field of Classification Search
CPC . G06F 1/181–1/182; H05K 7/20218–7/20381; H05K 7/20409–7/20418; H05K 7/20009–7/202; H05K 7/20781; H05K 7/20136; H05K 7/20736; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 7,558,063 B2 | 7/2009 | Belady et al. | |
| 7,660,116 B2* | 2/2010 | Claassen | G06F 1/20 165/80.4 |
| 7,944,694 B2 | 5/2011 | Campbell et al. | |
| 8,403,736 B2* | 3/2013 | Rasmussen | H05K 7/20572 361/695 |
| 8,599,557 B2* | 12/2013 | Peterson | G06F 1/20 165/104.21 |
| 8,638,559 B2* | 1/2014 | Barina | H01L 23/4093 165/104.21 |
| 8,648,249 B1* | 2/2014 | West | F28D 15/00 136/246 |

(Continued)

OTHER PUBLICATIONS

VanHemert, K.; "Build a Kick-Ass Liquid Cooling System in 6 Simple Steps"; Apr. 1, 2010; 13 pages.

(Continued)

*Primary Examiner* — Robert J Hoffberg
*Assistant Examiner* — Razmeen Gafur
(74) *Attorney, Agent, or Firm* — Brooks, Cameron & Huebsch, PLLC

(57) ABSTRACT

Example implementations relate to cooling modules. In some examples, a cooling module, can include an enclosure to replace a fan module, a first liquid cooling connector to receive and return cooling resources to a heat exchanger, and a second liquid cooling connector to provide the cooling resources to a manifold.

15 Claims, 3 Drawing Sheets

(56) References Cited

U.S. PATENT DOCUMENTS

| | | | | |
|---|---|---|---|---|
| 8,780,555 | B2* | 7/2014 | Fink | H05K 7/20 165/104.33 |
| 9,007,221 | B2* | 4/2015 | Zeighami | H05K 7/20781 340/605 |
| 9,516,794 | B2 | 12/2016 | Mulcahy et al. | |
| 9,913,403 | B2* | 3/2018 | Krug, Jr. | H05K 7/20772 |
| 2004/0201960 | A1* | 10/2004 | Karppinen | H05K 7/20572 361/690 |
| 2005/0241803 | A1* | 11/2005 | Malone | G06F 1/20 165/80.4 |
| 2006/0161311 | A1 | 7/2006 | Vinson et al. | |
| 2007/0159797 | A1* | 7/2007 | Teneketges | H01L 23/473 361/699 |
| 2009/0097200 | A1* | 4/2009 | Sharma | G06F 1/18 361/688 |
| 2009/0213541 | A1* | 8/2009 | Butterbaugh | H01L 23/473 361/689 |
| 2009/0262501 | A1* | 10/2009 | Claassen | G06F 1/20 361/701 |
| 2009/0306833 | A1* | 12/2009 | Vinson | G05D 23/19 700/282 |
| 2011/0308783 | A1 | 12/2011 | Nicewonger | |
| 2011/0313576 | A1* | 12/2011 | Nicewonger | F28D 15/00 700/282 |
| 2012/0153718 | A1* | 6/2012 | Rawlinson | H02K 5/20 307/10.1 |
| 2012/0327602 | A1* | 12/2012 | Kulkarni | H02M 7/003 361/700 |
| 2013/0130149 | A1* | 5/2013 | Devoe | H01M 8/0215 429/481 |
| 2013/0264030 | A1 | 10/2013 | Eckberg et al. | |
| 2013/0333865 | A1 | 12/2013 | Goth et al. | |
| 2014/0352760 | A1* | 12/2014 | Haynes | H02J 5/005 136/246 |
| 2014/0362527 | A1* | 12/2014 | Best | G06F 1/20 361/679.53 |
| 2014/0376178 | A1* | 12/2014 | Moore | G06F 1/20 361/679.53 |
| 2015/0003015 | A1* | 1/2015 | Kulkarni | H05K 7/1432 361/700 |
| 2015/0062806 | A1* | 3/2015 | Shelnutt | H05K 7/203 361/679.53 |
| 2015/0173252 | A1* | 6/2015 | Zeighami | H05K 7/20781 340/606 |
| 2015/0334879 | A1* | 11/2015 | Fricker | H05K 7/20781 361/679.47 |
| 2016/0014932 | A1* | 1/2016 | Best | H05K 7/20763 361/679.53 |
| 2016/0066480 | A1* | 3/2016 | Eckberg | H05K 7/20772 361/679.53 |
| 2017/0013746 | A1* | 1/2017 | Campbell | H05K 7/20781 |
| 2017/0105313 | A1 | 4/2017 | Shedd et al. | |
| 2017/0126143 | A1* | 5/2017 | White | H04L 67/22 |
| 2017/0127575 | A1* | 5/2017 | Lunsman | F16L 37/12 |
| 2017/0181326 | A1* | 6/2017 | Shelnutt | G05D 7/0629 |
| 2018/0131128 | A1* | 5/2018 | Franz | H01R 13/5219 |
| 2018/0192544 | A1* | 7/2018 | Reynov | H05K 7/20309 |
| 2018/0279510 | A1* | 9/2018 | Johnson | H05K 7/20781 |

OTHER PUBLICATIONS

Electronics Technology; "Stäubli Connectors—Thermal Management and Electronics Cooling for Supercomputers and Data Centers" printed on Sep. 14, 2017 from http:www.electronics-technology.com/contractors/electronic-componenets/satubi-connectors/, 3 pages.

* cited by examiner

COOLING MODULE

BACKGROUND

Racks in a datacenter can include a plurality of server chassis. The server chassis can include a cooling system such as an air-cooled system or a liquid cooled system. In a liquid cooled system, a coolant distribution unit (CDU) can deliver conditioned liquid (e.g., water) to the number of racks in the datacenter. The CDUs within a datacenter can operate with redundancy to ensure that if one or more CDUs malfunction that additional CDUs can maintain cooling of the racks. A number of CDUs can each include an individual reservoir to contain excess liquid for utilizing with a cooling system coupled to the number of CDUs. The conditioned liquid can be received at a number of server racks that include a plurality of server chassis.

DETAILED DESCRIPTION

Example implementations relate to cooling modules. In some examples, a cooling module, can include an enclosure to replace a fan module, a first liquid cooling connector to receive and return cooling resources to a heat exchanger, and a second liquid cooling connector to provide the cooling resources to a manifold. The systems, devices, and methods described herein can be utilized to alter an air-cooled chassis to a liquid cooled chassis. As used herein, a chassis can, for example, be an enclosure to protect and organize a plurality of computing devices (e.g., servers, server blades, etc.). As used herein, a server rack can, for example, be a framework for storing a plurality of chassis, cooling devices, and/or computing devices.

In some examples, the chassis can include a plurality of computing devices. For example, the chassis can include a plurality of servers to provide computing resources. In some examples, the plurality of computing devices can be altered to include increased computing resources. For example, the plurality of computing devices can be altered to have upgraded processing resources and/or memory resources. In these examples, the heat generated by the plurality of computing devices can be greater when the computing devices are altered with increased computing resources. In these examples, the cooling resources that are provided to the plurality of computing devices may be increased to counter the increased heat generated by the altered computing devices.

In some examples, the cooling modules described herein can be utilized to increase a cooling capacity and/or power capacity of a chassis. For example, a number of cooling modules described herein can replace a corresponding number of fan modules. In this example, the number of cooling modules can provide liquid cooling resources to computing devices of the chassis. In some examples, the number of cooling modules can also provide additional electrical power to the computing devices of the chassis. Thus, the cooling modules can increase the cooling capacity to counter the increased heat generated by an altered computing device as well as provide additional electrical power that may be utilized to power the altered computing device.

The systems described herein can increase a pumping capacity and redundancy for each of the plurality of server chassis coupled to a server rack. In addition, the systems described herein can provide an increase in pumping and powering flexibility, which can be utilized to allocate cooling resources based on a usage of particular server chassis coupled to the server rack. Furthermore, the systems described herein can be utilized to support additional functionality (e.g., turbo mode, overclocking, etc.) of computing devices coupled to each of the plurality of server chassis by utilizing the increased pumping capacity of the system.

Figure 1:
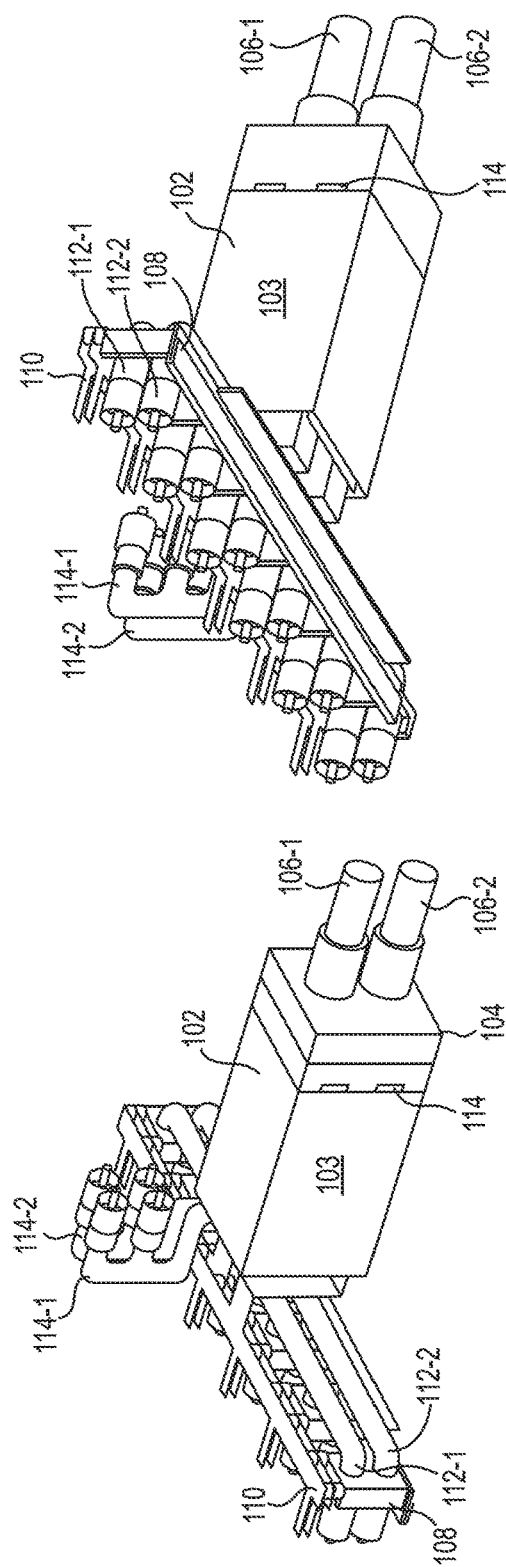
FIG. 1 illustrates an example cooling module consistent with the present disclosure.

FIG. 1 illustrates an example cooling module 102 consistent with the present disclosure. In some examples, the cooling module 102 can be utilized to replace a fan module of a chassis. For example, the cooling module 102 can include an enclosure 103 that can be received by a fan module slot of the chassis. In some examples, the cooling module 102 can include an enclosure 103 that is the same or similar size (e.g., height, width, length, etc.) as a fan module utilized by the chassis.

In some examples, the cooling module 102 can also include a number of locking mechanisms 114 of the enclosure 103 that can correspond to locking mechanisms of the chassis. For example, the number of locking mechanisms 114 can include notches that correspond to locking mechanisms of the chassis that can retain the cooling module 102 in a fan module slot of the chassis. In another example, the number of locking mechanisms can be apertures for receiving a number of screws or other mechanism that can be utilized to couple the cooling module 102 within the fan module slot of the chassis.

In some examples, the cooling module 102 can include a number of liquid cooling connectors 106-1, 106-2. In some examples, the number of liquid cool connectors 106-1, 106-2 can be blind mate connectors. As used herein, a blind mate connector can, for example, be a connector with a self-alignment feature to align a corresponding connector and a tool-less mechanism to couple the blind mate connector to a corresponding connector without the use of a mechanical tool (e.g., wrench, screw driver, etc.).

In some examples, the number of liquid cooling connectors 106-1, 106-2 can be coupled to a coolant distribution unit (CDU) and/or other type of resource that provides liquid cooling resources (e.g., chilled water, water, coolant, etc.). In some examples, the number of liquid connectors 106-1, 106 can be utilized to receive cooling resources from the CDU and a number of corresponding liquid cooling connectors (not shown) that can be coupled to a number of manifolds 112-1, 112-2. As used herein, the number of manifolds 112-1, 112-2 can, for example, a device that receives liquid cooling resources at an input and branch into a plurality of outputs.

In some examples, the number of manifolds can be utilized to provide cooling resources from the cooling module 102 to a plurality of computing devices coupled to a chassis. For example, each output of the number of manifolds 112-1, 112-2 can be coupled to a liquid cooling system of a particular computing device. In this example, the liquid cooling system for a computing device coupled to the chassis can include a cold plate or liquid heat sink to receive the cooling resources from the number of manifolds 112-1, 112-2 to cool a number of computing components (e.g., processor, memory modules, etc.). For example, a liquid heat sink or a cold plate can be positioned over a processor to transfer heat generated by the processor to the cooling resources within the liquid heat sink or cold plate. In this example, the cooling resources can be circulating within the liquid heat sink or cold plate to remove the cooling resources that have been heated by the heat generated by the processor.

As described herein, the cooling module 102 can be coupled to the number of manifolds 112-1, 112-2 to provide cooling resources to a cooling system of a plurality of computing devices. In some examples, the number of manifolds can include a "hot" manifold and a "cold" manifold. For example, the manifold 112-1 can be a cold manifold and the manifold 112-2 can be a hot manifold. In this example, the manifold 112-1 can be utilized to provide cooling resources to a cooling system of a computing device and the manifold 112-2 can be utilized to receive cooling resources from the cooling system of the computing device. In this way, the cooling resources can be circulated between the computing devices and a heat exchanger or chiller.

As used herein, a hot manifold can, for example, be a manifold that receives cooling resources that have been utilized to cool computing components and/or utilized by a cooling system of a computing device. As used herein, a cold manifold can, for example, be a manifold that receives cooling resources from a heat exchanger or chiller and provides the cooling resources to a cooling system of a computing device. That is, the hot manifold can include cooling resources that are relatively warmer since they have been utilized by the cooling system of a computing device and the cold manifold can include cooling resources that are relatively cooler since they have been received from a heat exchanger or chiller that cools the cooling resources.

In some examples, the number of manifolds 112-1, 112-2 can include auxiliary manifolds 114-1, 114-2. In some examples, the auxiliary manifolds 114-1, 114-2 can be utilized to provide cooling resources from the cooling module 102 to a cooling system of a number of switches (e.g., optical switches, etc.) and/or switch bays (e.g., Interconnect Module (ICM) bays. In some examples, the number of switches and/or ICM bays can be positioned above or below the number of manifolds 112-1, 112-2 and/or above or below the number of computing devices within the chassis. In some examples, the number of switches and/or the ICM bays may be altered when the number of computing devices of the chassis are altered as described herein. In some examples, the alteration of the number of switches and/or the ICM bays can increase heat generated by the number of switches and/or the modules within the ICM bays. As described herein, providing liquid cooling resources via the cooling module 102 can maintain the temperature of the number of switches and/or ICM bays within a particular temperature range that is safe for the number of switches and/or modules within the ICM bays.

In some examples, the cooling module 102 can include an electrical connection 104. In some examples, the electrical connection 104 can be coupled to a power source. For example, the electrical connection 104 can be coupled to an output of a power distribution unit (PDU) that provides electrical power to a number of devices. As used herein, a PDU can, for example, be a device that distributes electrical power to a plurality of electrical devices. In some examples, the PDU can be coupled to each of a number of computing devices of a chassis. In some examples, the PDU can be coupled to the chassis to provide power to the number of computing devices coupled to the chassis. As described herein, the number of computing devices can be altered or upgraded with components that can generate additional heat. In addition, the altered or upgraded components can utilize an increased quantity of electrical energy. In these examples, the cooling module 102 can receive additional electrical energy from a PDU via the electrical connection 104.

In some examples, the electrical connection 104 can be coupled to a busbar 110. As used herein, a busbar 110 can, for example, include a device with electrical connectors where electrical power is concentrated for distribution. In some examples, the busbar 110 can distribute the electrical energy received at the electrical connection to the number of computing devices. For example, each of a plurality of servers can be electrically coupled to a corresponding output of the busbar 110 to receive electrical energy from the cooling module 102. In some examples, the electrical energy provided by the busbar 110 can be in addition to electrical energy provided by the chassis and/or an external PDU as described herein. For example, the busbar 110 can be coupled to an auxiliary power input of a computing device coupled to the chassis. In this example, the computing device can utilize a main power source and the auxiliary power to perform computing operations. In this example, the auxiliary power may be utilized when the computing device includes altered computing components that utilize additional electrical energy to operate compared to the replaced components.

In some examples, the cooling module 102 can include a bracket 108 that can be coupled to the number of manifolds 112-1, 112-2 and/or the busbar 110. In some examples, the bracket 108 can be utilized to maintain a position of the number of manifolds 112-1, 112-2 and/or the busbar 110. In some examples, the bracket 108 can maintain the position of the number of manifolds 112-1, 112-2 to prevent the number of manifolds 112-1, 112-2 from being damaged or disconnected from the cooling systems of the number of computing devices. For example, the number of manifolds 112-1, 112-2 can include a corresponding number of connections (e.g., blind mate connectors, etc.) that can be coupled to corresponding connections. In this example, the bracket 108 can maintain the position of the number of manifolds 112-1, 112-2 such that the corresponding number of connections are not disconnected from the corresponding number of connections.

In some examples, the number of manifolds 112-1, 112-2 can comprise a metal material that can be bent or damaged under a pressure that exceeds a threshold. For example, the number of manifolds 112-1, 112-2 can comprise a copper material that can be bent or damaged and prevent the flow of the cooling resources. In this example, the bracket 108 can prevent the copper material from being bent even when the pressure threshold is exceeded. In some examples, the bracket 108 can be utilized to maintain a position of the busbar 110 to prevent damage to the busbar 110 in a similar way as the number of manifolds 112-1, 112-2 and/or prevent the busbar 110 from being disconnected from a plurality of corresponding connections that couple the busbar 110 to the number of computing devices.

The cooling module 102 as illustrated in FIG. 1 can be utilized to replace a fan module from an air-cooled chassis to increase a cooling capacity of the chassis. As described herein, the cooling module 102 can include an enclosure 103 that can be positioned in a fan module bay to replace a fan module. In this way, an air-cooled chassis can be upgraded or converted to a liquid cooled chassis to provide additional cooling resources to the chassis. In addition, the cooling module 102 can include an electrical connection 104 that can provide additional electrical energy to the computing devices of the chassis.

Figure 2:
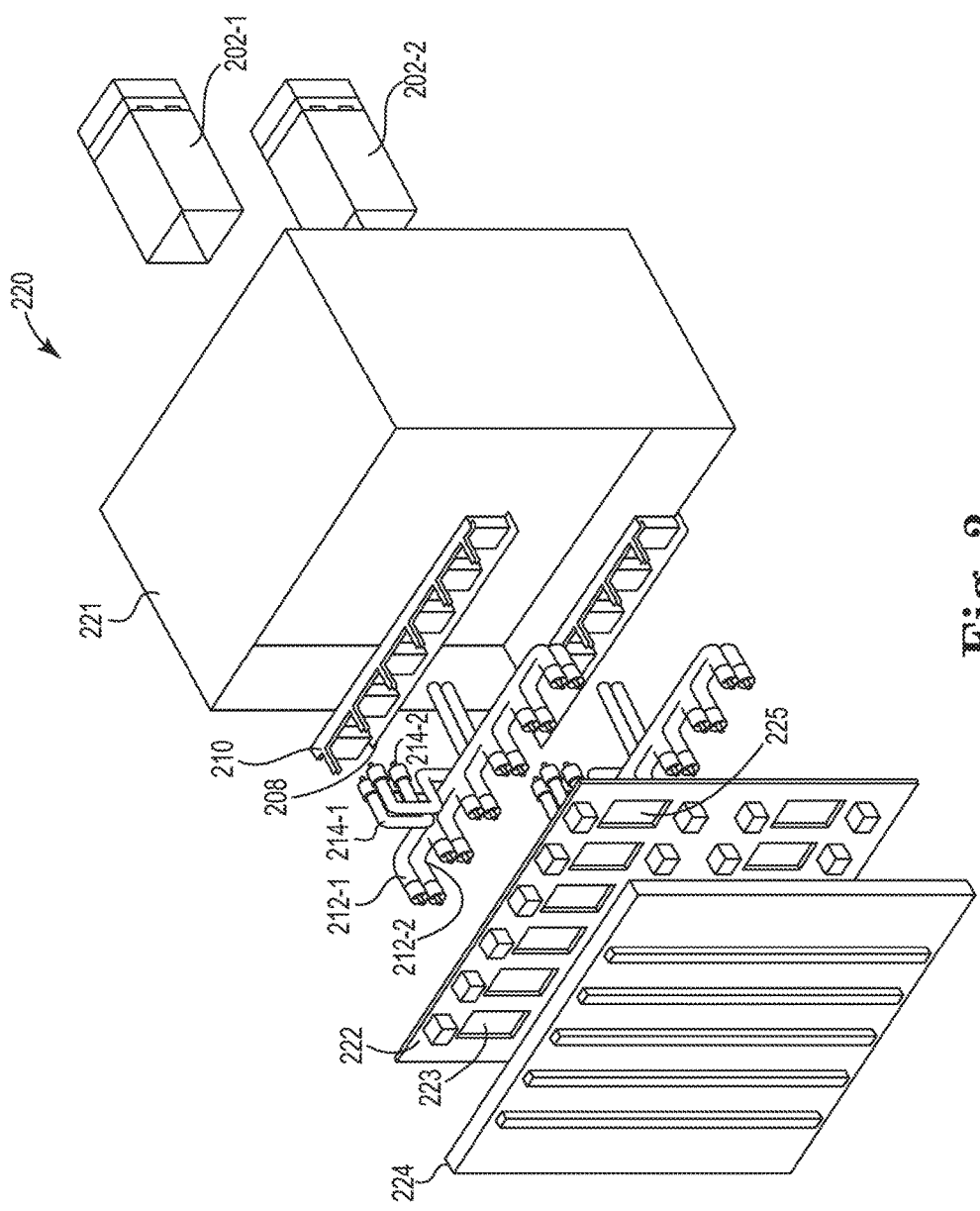
FIG. 2 illustrates an example system for a cooling module consistent with the present disclosure.

FIG. 2 illustrates an example system 220 for a cooling module 202-1, 202-2 consistent with the present disclosure.

FIG. 2 can illustrate an exploded view of the system 220 to illustrate each of the components of the system 220. In some examples, a number of cooling modules 202-1, 202-2 can be utilized to replace a number of fan modules of a chassis 221. For example, the number of cooling modules 202-1, 202-2 can include an enclosure that can be received by a fan module slot of the chassis 221. In some examples, the number of cooling modules 202-1, 202-2 can include an enclosure that is the same or similar size (e.g., height, width, length, etc.) as a fan module utilized by the chassis 221.

In some examples, the number of cooling modules 202-1, 202-2 can also include a number of locking mechanisms of the enclosure that can correspond to locking mechanisms of the chassis 221. For example, the number of locking mechanisms can include notches that correspond to locking mechanisms of the chassis 221 that can retain the number of cooling modules 202-1, 202-2 in a fan module slot of the chassis 221. In another example, the number of locking mechanisms can be apertures for receiving a number of screws or other mechanism that can be utilized to couple the number of cooling modules 202-1, 202-2 within the fan module slot of the chassis 221.

In some examples, the number of cooling modules 202-1, 202-2 can include a number of liquid cooling connectors. In some examples, the number of liquid cool connectors can be blind mate connectors. As used herein, a blind mate connector can, for example, be a connector with a self-alignment feature to align a corresponding connector and a tool-less mechanism to couple the blind mate connector to a corresponding connector without the use of a mechanical tool (e.g., wrench, screw driver, etc.).

In some examples, the number of liquid cooling connectors of the number of liquid cooling modules 202-1, 202-2 can be coupled to a coolant distribution unit (CDU) and/or other type of resource that provides liquid cooling resources (e.g., chilled water, water, coolant, etc.). In some examples, the number of liquid connectors of the liquid cooling modules 202-1, 202-2 can be utilized to receive cooling resources from the CDU and a number of corresponding liquid cooling connectors (not shown) that can be coupled to a number of manifolds 212-1, 212-2. As used herein, the number of manifolds 212-1, 212-2 can, for example, a device that receives liquid cooling resources at an input and branch into a plurality of outputs.

In some examples, the number of manifolds 212-1, 212-2 can be utilized to provide cooling resources from the number of cooling modules 202-1, 202-2 to a plurality of computing devices coupled to the chassis 221. For example, each output of the number of manifolds 212-1, 212-2 can be coupled to a liquid cooling system of a particular computing device. In this example, the liquid cooling system for a computing device coupled to the chassis 221 can include a cold plate or liquid heat sink to receive the cooling resources from the number of manifolds 212-1, 212-2 to cool a number of computing components (e.g., processor, memory modules, etc.). For example, a liquid heat sink or a cold plate can be positioned over a processor to transfer heat generated by the processor to the cooling resources within the liquid heat sink or cold plate. In this example, the cooling resources can be circulating within the liquid heat sink or cold plate to remove the cooling resources that have been heated by the heat generated by the processor.

As described herein, the number of cooling modules 202-1, 202-2 can be coupled to the number of manifolds 212-1, 212-2 to provide cooling resources to a cooling system of a plurality of computing devices. In some examples, the number of manifolds can include a "hot" manifold and a "cold" manifold. For example, the manifold 212-1 can be a cold manifold and the manifold 212-2 can be a hot manifold. In this example, the manifold 212-1 can be utilized to provide cooling resources to a cooling system of a computing device and the manifold 212-2 can be utilized to receive cooling resources from the cooling system of the computing device. In this way, the cooling resources can be circulated between the computing devices and a heat exchanger or chiller.

As used herein, a hot manifold can, for example, be a manifold that receives cooling resources that have been utilized to cool computing components and/or utilized by a cooling system of a computing device. As used herein, a cold manifold can, for example, be a manifold that receives cooling resources from a heat exchanger or chiller and provides the cooling resources to a cooling system of a computing device. That is, the hot manifold can include cooling resources that are relatively warmer since they have been utilized by the cooling system of a computing device and the cold manifold can include cooling resources that are relatively cooler since they have been received from a heat exchanger or chiller that cools the cooling resources.

In some examples, the number of manifolds 212-1, 212-2 can include auxiliary manifolds 214-1, 214-2. In some examples, the auxiliary manifolds 214-1, 214-2 can be utilized to provide cooling resources from the number of cooling modules 202-1, 202-2 to a cooling system of a number of switches (e.g., optical switches, etc.) and/or switch bays (e.g., Interconnect Module (ICM) bays). In some examples, the number of switches and/or ICM bays can be positioned above or below the number of manifolds 212-1, 212-2 and/or above or below the number of computing devices within the chassis 221. In some examples, the number of switches and/or the ICM bays may be altered when the number of computing devices of the chassis are altered as described herein. In some examples, the alteration of the number of switches and/or the ICM bays can increase heat generated by the number of switches and/or the modules within the ICM bays. As described herein, providing liquid cooling resources via the number of cooling module 202-1, 202-2 can maintain the temperature of the number of switches and/or ICM bays within a particular temperature range that is safe for the number of switches and/or modules within the ICM bays.

In some examples, the number of cooling modules 202-1, 202-2 can include an electrical connection. In some examples, the electrical connection can be coupled to a power source. For example, the electrical connection can be coupled to an output of a power distribution unit (PDU) that provides electrical power to a number of devices. As used herein, a PDU can, for example, is a device that distributes electrical power to a plurality of electrical devices. In some examples, the PDU can be coupled to each of a number of computing devices of a chassis 221. In some examples, the PDU can be coupled to the chassis 221 to provide power to the number of computing devices coupled to the chassis 221. As described herein, the number of computing devices can be altered or upgraded with components that can generate additional heat. In addition, the altered or upgraded components can utilize an increased quantity of electrical energy. In these examples, the cooling module 102 can receive additional electrical energy from a PDU via the electrical connection.

In some examples, the electrical connection can be coupled to a busbar 210. As used herein, a busbar 210 can, for example, include a device with electrical connectors where electrical power is concentrated for distribution. In some examples, the busbar 210 can distribute the electrical energy received at the electrical connection to the number of computing devices. For example, each of a plurality of servers can be electrically coupled to a corresponding output of the busbar 210 to receive electrical energy from the number of cooling modules 202-1, 202-2. In some examples, the electrical energy provided by the busbar 210 can be in addition to electrical energy provided by the chassis and/or an external PDU as described herein. For example, the busbar 210 can be coupled to an auxiliary power input of a computing device coupled to the chassis 221. In this example, the computing device can utilize a main power source and the auxiliary power to perform computing operations. In this example, the auxiliary power may be utilized when the computing device includes altered computing components that utilize additional electrical energy to operate compared to the replaced components.

In some examples, the system 220 can include a door assembly 222 that can be coupled to the chassis 221. In some examples, the door assembly 222 can include a plurality of apertures 223 to allow the branches of the number of manifolds 212-1, 212-2 to pass through the door assembly 222 such that the number of manifolds 212-1, 212-2 can be coupled to a corresponding cooling system of the number of computing devices as described herein. In some examples, the door assembly 222 can include a number of doors 225 that can be opened or closed to allow air to pass through an aperture 223 of the door assembly 222. In this way, the chassis 221 can be air cooled through the aperture 223 when the number of doors 225 are in an open position.

In some examples, the system 220 can include a midplane 224 that can be coupled to the door assembly 222 and/or coupled to the busbar 210. In some examples, the midplane 224 can receive electrical energy from the busbar 210. In some examples, the midplane 224 can be include a plurality of electrical connectors that can be electrically coupled to the number of computing devices to provide additional electrical energy to the number of computing devices as described herein. In some examples, the midplane 224 can include apertures that correspond to the apertures 223 of the door assembly 222. Thus, the number of manifolds 212-1, 212-2 can be coupled to the number of computing devices through the door assembly 222 and through the midplane 224.

In some examples, the number of cooling modules 202-1, 202-2 can include a bracket 208 that can be coupled to the number of manifolds 212-1, 212-2 and/or the busbar 210. In some examples, the bracket 208 can be utilized to maintain a position of the number of manifolds 212-1, 212-2 and/or the busbar 210 within the chassis 221. In some examples, the bracket 208 can maintain the position of the number of manifolds 212-1, 212-2 to prevent the number of manifolds 212-1, 212-2 from being damaged or disconnected from the cooling systems of the number of computing devices coupled to the chassis 221. For example, the number of manifolds 212-1, 212-2 can include a corresponding number of connections (e.g., blind mate connectors, etc.) that can be coupled to corresponding connections. In this example, the bracket 208 can maintain the position of the number of manifolds 212-1, 212-2 such that the corresponding number of connections are not disconnected from the corresponding number of connections.

In some examples, the number of manifolds 212-1, 212-2 can comprise a metal material that can be bent or damaged under a pressure that exceeds a threshold. For example, the number of manifolds 212-1, 212-2 can comprise a copper material that can be bent or damaged and prevent the flow of the cooling resources. In this example, the bracket 208 can prevent the copper material from being bent even when the pressure threshold is exceeded. In some examples, the bracket 208 can be utilized to maintain a position of the busbar 210 to prevent damage to the busbar 210 in a similar way as the number of manifolds 212-1, 212-2 and/or prevent the busbar 210 from being disconnected from a plurality of corresponding connections that couple the busbar 210 to the number of computing devices.

The system 220 can be utilized to replace a fan module from an air-cooled chassis 221 to increase a cooling capacity of the chassis 221. As described herein, the number of cooling modules 202-1, 202-2 can include an enclosure that can be positioned in a fan module bay to replace a fan module of the chassis 221. In this way, an air-cooled chassis 221 can be upgraded or converted to a liquid cooled chassis 221 to provide additional cooling resources to the number of computing devices coupled to the chassis 221. In addition, the number of cooling modules 202-1, 202-2 can include an electrical connection that can provide additional electrical energy to the midplane 224 and/or the computing devices of the chassis 221.

Figure 3:
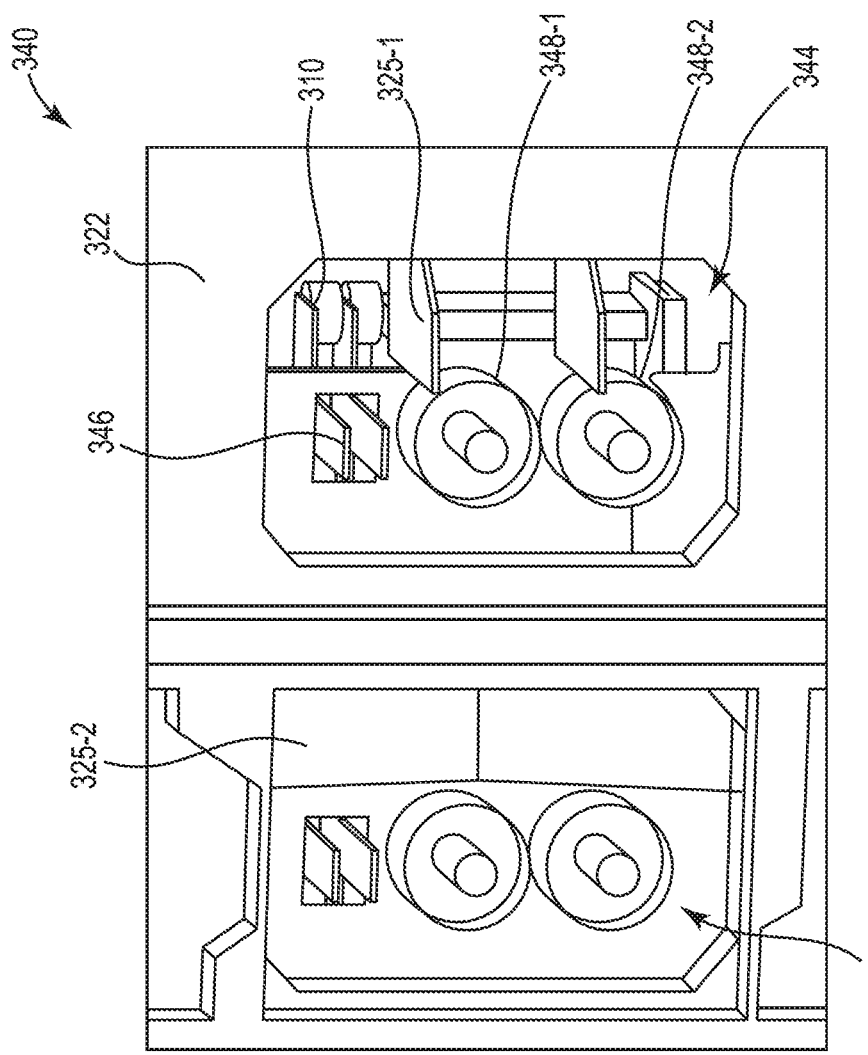
FIG. 3 illustrates an example system for a cooling module consistent with the present disclosure.

FIG. 3 illustrates an example system 340 for a cooling module consistent with the present disclosure. In some examples, the system 340 can be part of a larger system that includes a chassis, a number of cooling modules to replace fan modules, and/or a number of computing devices. In some examples, the system 340 can illustrate a door assembly 322 (e.g., door assembly 222 as referenced in FIG. 2, etc.). The door assembly 322 can be utilized to receive liquid cooling connectors 348-1, 348-2 of a manifold (e.g., manifold 112-1, 112-2 as referenced in FIG. 1, manifold 212-1, 212-2 as referenced in FIG. 2, etc.). As described herein, the liquid cooling connectors 348-1, 348-2 can be blind mate connectors.

In some examples, the system 340 can include a door assembly 322 that can be coupled to the chassis. In some examples, the door assembly 322 can include a plurality of apertures 323 to allow the branches and/or liquid cooling connectors 448-1, 448-2 of the number of manifolds to pass through the door assembly 322 such that the number of manifolds can be coupled to a corresponding cooling system of the number of computing devices as described herein.

In some examples, the door assembly 322 can include a number of doors 325-1, 325-2 that can be opened or closed to allow air to pass through an aperture 323 of the door assembly 322. In this way, the chassis can be air cooled through the aperture 323 when the number of doors 325-1, 325-2 are in an open position. For example, the door 325-1 can be in an open position and the door 325-2 can be in a closed position. In this example, the door 325-2 in the closed position can prevent air flow from passing through the aperture 323. in this example, the door 325-1 in the open position can allow air flow to pass through the aperture 323 via an open area 344.

In some examples, the system 340 can include a busbar 310 that includes a busbar connector 346 that can be positioned through an aperture 323 of the door assembly 322. For example, the busbar 310 can include a busbar connector 346 that protrudes through the aperture 323 of the door assembly 322 such that the busbar connector 346 can be electrically coupled to the number of computing devices to provide additional electrical energy to the number of computing devices.

As described herein, the liquid cooling connectors 348-1, 348-2 can be coupled to corresponding manifolds. In some examples, the number of manifolds can include a "hot"

manifold and a "cold" manifold. For example, the liquid cooling connector 348-2 can be coupled to a cold manifold and the liquid cooling connector 348-1 can be coupled to a hot manifold. In this example, the liquid cooling connector 348-1 can be coupled to a manifold that can be utilized to provide cooling resources to a cooling system of a computing device and the liquid cooling connector 348-2 can be coupled to a manifold that can be utilized to receive cooling resources from the cooling system of the computing device. In this way, the cooling resources can be circulated between the computing devices and a heat exchanger or chiller.

The system 340 can be utilized to replace a fan module from an air-cooled chassis to increase a cooling capacity of the chassis. As described herein, the door assembly 322 can be utilized to allow the liquid cooling connectors 348-1, 348-2 to protrude through the aperture 323 of the door assembly 322. In addition, the door assembly 322 can include a number of doors 325-1, 325-2 that can be opened and closed to control airflow within the chassis. Thus, in some examples, the system 340 can be utilized to provide a chassis with an air-cooled system and a liquid cooled system. For example, the computing devices of the chassis can be upgraded to increase computing capacity by altering an air-cooled chassis to a chassis that utilizes both air cooling and liquid cooling systems. In addition, the system 340 can provide additional electrical energy to the computing devices of the chassis via a busbar 310 as described herein. Thus, the system 340 can be utilized to increase the computing capacity of a chassis.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. As used herein, the designator "N", particularly with respect to reference numerals in the drawings, indicates that a number of the particular feature so designated can be included with examples of the present disclosure. The designators can represent the same or different numbers of the particular features. Further, as used herein, "a number of" an element and/or feature can refer to one or more of such elements and/or features.

What is claimed:

1. A cooling module configured to replace a fan module of an air-cooled chassis, the cooling module comprising:
   an enclosure to replace the fan module, wherein the enclosure is configured to be received by a fan module slot of the air-cooled chassis;
   a first liquid cooling connector attached to the enclosure to receive liquid from a heat exchanger; and
   a second liquid cooling connector attached to the enclosure to provide the liquid to a manifold inside the air-cooled chassis.

2. The cooling module of claim 1, comprising an electrical connection to receive electrical power from a power distribution unit (PDU).

3. The cooling module of claim 1, comprising a number of bus bar connectors.

4. The cooling module of claim 3, wherein the number of bus bar connectors are provided an electrical power via an electrical connection that receives power from a PDU.

5. The cooling module of claim 1, wherein the first liquid cooling connector and the second liquid cooling connector are blind mate liquid cooling connectors.

6. The cooling module of claim 1, comprising a number of vents to allow air flow to pass by the first liquid cooling connector and the second liquid cooling connector.

7. A system, comprising:
   a fan module bay of a chassis, the fan module bay including a plurality of bay slots to receive fan modules;
   a plurality of fans to couple to a first portion of the plurality of bay slots;
   a liquid cooling module to couple to a second portion of the plurality of bay slots, wherein the liquid cooling module includes an enclosure received by the second portion of the plurality of bay slots and liquid cooling connectors to receive liquid from outside the chassis and provide the liquid to an interior of the chassis; and
   a door assembly coupled to the fan module bay to allow air flow from the plurality of fans and to allow a manifold to be coupled to the liquid cooling module.

8. The system of claim 7, wherein the liquid cooling connectors include a number of liquid inputs coupled to a cooling distribution unit and a number of liquid outputs coupled to the manifold.

9. The system of claim 7, comprising a midplane coupled to the door assembly to receive electrical power from a bus bar coupled to the liquid cooling module.

10. The system of claim 9, wherein the liquid cooling module is coupled to a power distribution unit to provide the electrical power to the bus bar.

11. The system of claim 9, wherein the midplane is electrically coupled to a plurality of servers to provide additional electrical power to the plurality of servers.

12. A server chassis device, comprising:
   a fan module bay including a plurality of bay slots to receive fan modules at a first end of the fan module bay;
   a plurality of fans to couple to a first portion of the plurality of bay slots;
   a plurality of liquid cooling modules to couple to a second portion of the plurality of bay slots, wherein the plurality of liquid cooling modules include liquid inputs coupled to a cooling distribution unit (CDU) and an electrical connector coupled to a power distribution unit (PDU), wherein each liquid cooling module of the plurality of liquid cooling modules includes an enclosure received by the second portion of the plurality of bay slots;
   a bus bar assembly electrically coupled to the electrical connector of the plurality of liquid cooling modules to provide electrical power to a plurality of servers; and
   a door assembly coupled to a second end of the fan module bay to allow air flow from the plurality of fans to provide air cooling resources to the plurality of servers and to allow a plurality of manifolds to be coupled to the plurality of liquid cooling modules to provide liquid cooling resources to the plurality of servers.

13. The server chassis device of claim 12, wherein the plurality of liquid cooling modules provide liquid cooling resources to each of the plurality of servers.

14. The server chassis device of claim 12, wherein the bus bar assembly provides additional electrical power to the plurality of servers.

15. The server chassis device of claim 12, wherein the door assembly is positioned between the bus bar assembly and a midplane support assembly that provides the electrical power to the plurality of servers.

* * * * *